(12) United States Patent
Zaal et al.

(10) Patent No.: US 7,227,619 B2
(45) Date of Patent: Jun. 5, 2007

(54) LITHOGRAPHIC APPARATUS AND DEVICE MANUFACTURING METHOD

(75) Inventors: Koen Jacobus Johannes Maria Zaal, Eindhoven (NL); Jeroen Johannes Sophia Maria Mertens, Duizel (NL); Joost Jeroen Ottens, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 56 days.

(21) Appl. No.: 10/814,815

(22) Filed: Apr. 1, 2004

(65) Prior Publication Data

US 2005/0219499 A1    Oct. 6, 2005

(51) Int. Cl.
   *G03B 27/42* (2006.01)
(52) U.S. Cl. .................. 355/73; 355/73; 355/75
(58) Field of Classification Search .................. None
   See application file for complete search history.

(56) References Cited

U.S. PATENT DOCUMENTS

| | | | |
|---|---|---|---|
| 3,573,975 A | 4/1971 | Dhaka et al. .............. 117/212 |
| 3,648,587 A | 3/1972 | Stevens .................. 95/44 |
| 4,213,698 A | 7/1980 | Firtion et al. | |
| 4,346,164 A | 8/1982 | Tabarelli et al. ........... 430/311 |
| 4,390,273 A | 6/1983 | Loebach et al. ........... 355/125 |
| 4,396,705 A | 8/1983 | Akeyama et al. .......... 430/326 |
| 4,480,910 A | 11/1984 | Takanashi et al. ......... 355/30 |
| 4,509,852 A * | 4/1985 | Tabarelli et al. .......... 355/30 |
| 5,040,020 A | 8/1991 | Rauschenbach et al. .... 355/53 |
| 5,121,256 A | 6/1992 | Corle et al. .............. 359/664 |
| 5,324,012 A | 6/1994 | Aoyama et al. | |
| 5,374,829 A | 12/1994 | Sakamoto et al. | |
| 5,583,736 A | 12/1996 | Anderson et al. | |
| 5,610,683 A * | 3/1997 | Takahashi ................ 355/53 |
| 5,715,039 A | 2/1998 | Fukuda et al. ............ 355/53 |
| 5,825,043 A | 10/1998 | Suwa .................... 250/548 |
| 5,900,354 A | 5/1999 | Batchelder ............... 430/395 |
| 5,923,408 A | 7/1999 | Takabayashi | |
| 6,191,429 B1 | 2/2001 | Suwa .................... 250/548 |
| 6,232,615 B1 | 5/2001 | Van Empel | |
| 6,236,634 B1 | 5/2001 | Lee et al. ............... 369/112 |
| 6,560,032 B2 | 5/2003 | Hatano .................. 359/656 |
| 6,600,547 B2 | 7/2003 | Watson et al. | |
| 6,603,130 B1 | 8/2003 | Bisschops et al. ........ 250/492.1 |
| 6,633,365 B2 | 10/2003 | Suenaga ................. 355/53 |

(Continued)

FOREIGN PATENT DOCUMENTS

DE      206 607      2/1984

(Continued)

OTHER PUBLICATIONS

M. Switkes et al., "Immersion Lithography at 157 nm", MIT Lincoln Lab, Orlando 2001-1, Dec. 17, 2001.

(Continued)

*Primary Examiner*—D. Rutledge
(74) *Attorney, Agent, or Firm*—Pillsbury Winthrop Shaw Pittman LLP

(57) ABSTRACT

A burl plate for use in immersion lithography has a higher burl density in a peripheral portion than in a medial portion so that when a higher pressure differential is applied in the peripheral portion the compression of the burls in the peripheral portion is substantially the same as in the medial portion.

24 Claims, 3 Drawing Sheets

U.S. PATENT DOCUMENTS

| | | |
|---|---|---|
| 6,809,802 B1 * | 10/2004 | Tsukamoto et al. ............ 355/72 |
| 2002/0020821 A1 | 2/2002 | Van Santen et al. ......... 250/492 |
| 2002/0163629 A1 | 11/2002 | Switkes et al. ................ 355/53 |
| 2003/0123040 A1 | 7/2003 | Almogy ....................... 355/69 |
| 2003/0127605 A1 | 7/2003 | Kondo |
| 2003/0174408 A1 | 9/2003 | Rostalski et al. ............ 359/642 |
| 2004/0000627 A1 | 1/2004 | Schuster |
| 2004/0021844 A1 | 2/2004 | Suenaga |
| 2004/0036850 A1 | 2/2004 | Tsukamoto et al. |
| 2004/0075895 A1 | 4/2004 | Lin ............................. 359/380 |
| 2004/0109237 A1 | 6/2004 | Epple et al. |
| 2004/0119954 A1 | 6/2004 | Kawashima et al. ........... 355/30 |
| 2004/0125351 A1 | 7/2004 | Krautschik et al. ............ 355/53 |
| 2005/0122505 A1 | 6/2005 | Miyajima |
| 2005/0151947 A1 * | 7/2005 | Fujimaki ...................... 355/55 |

FOREIGN PATENT DOCUMENTS

| | | |
|---|---|---|
| DE | 221 563 | 4/1985 |
| DE | 224448 | 7/1985 |
| DE | 242880 | 2/1987 |
| EP | 0023231 | 2/1981 |
| EP | 0418427 | 3/1991 |
| EP | 1039511 | 9/2000 |
| FR | 2474708 | 7/1981 |
| JP | 58-202448 | 11/1983 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | 06-124873 | 5/1994 |
| JP | 07018438 * | 1/1995 |
| JP | 07-132262 | 5/1995 |
| JP | 07-220990 | 8/1995 |
| JP | 10050810 * | 2/1998 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000-058436 | 2/2000 |
| JP | 2001-091849 | 4/2001 |
| JP | 2004-193252 | 7/2004 |
| WO | WO 99/49504 | 9/1999 |
| WO | WO 03/077036 | 9/2003 |
| WO | WO 03/077037 | 9/2003 |
| WO | WO 2004/019128 | 3/2004 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |

OTHER PUBLICATIONS

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithography: Optics for the 50 nm Node", 157 Anvers-1, Sep. 4, 2002.

B.J. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths To Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21, 008, pp. 68-72.

S. Owa et al., "Immersion Lithography; its potential preformance and issues", SPIE Microlithography 2003, 5040-186, Feb. 27, 2003.

S. Owa et al., "Advantage and Feasibility of Immersion Lithography", Proc. SPIE 5040 (2003).

Nikon Precision Europe GmbH, "Investor Relations—Nikon's Real Solutions", May 15, 2003.

H. Kawata et al., "Optical Projection Lithography using Lenses with Numerical Apertures Greater than Unity", Microelectronic Engineering 9 (1989), pp. 31-36.

J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.

B.W. Smith et al., "Immersion Optical Lithography at 193nm", Future Fab International, vol. 15, Jul. 11, 2003.

H. Kawata et al., "Fabrication of 0.2 μm Fine Patterns Using Optical Projection Lithography with an Oil Immersion Lens", Jpn. J. Appl. Phys. vol. 31 (1992), pp. 4174-4177.

G. Owen et al., "⅛μm Optical Lithography", J. Vac. Sci. Technol. B., vol. 10, No. 6, Nov./Dec. 1992, pp. 3032-3036.

H. Hogan, "New Semiconductor Lithography Makes a Splash", Photonics Spectra, Photonics TechnologyWorld, Oct. 2003 Edition, pp. 1-3.

S. Owa and N. Nagasaka, "Potential Performance and Feasibility of Immersion Lithography", NGL Workshop 2003, Jul. 10, 2003, Slide Nos. 1-33.

S. Owa et al., "Update on 193nm immersion exposure tool", Litho Forum, International SEMATECH, Los Angeles, Jan. 27-29, 2004, Slide Nos. 1-51.

H. Hata, "The Development of Immersion Exposure Tools", Litho Forum, International SEMATECH, Los Angeles, Jan. 27-29, 2004, Slide Nos. 1-22.

T. Matsuyama et al., "Nikon Projection Lens Update", SPIE Microlithography 2004, 5377-65, Mar. 2004.

"Depth-of-Focus Enhancement Using High Refractive Index Layer on the Imaging Layer", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

B. Lin, The $\kappa_3$ coefficient in nonparaxial $\lambda$/NA scaling equations for resolution, depth of focus, and immersion lithography, *J. Microlith., Microfab., Microsyst.* 1(1):7-12 (2002).

EP Search Report for EP Application No. 05252043, Dated Jun. 29, 2005.

* cited by examiner

LITHOGRAPHIC APPARATUS AND DEVICE MANUFACTURING METHOD

FIELD

The present invention relates to a lithographic apparatus and a device manufacturing method.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion at one time, and so-called scanners, in which each target portion is irradiated by scanning the pattern through the projection beam in a given direction (the "scanning"-direction) while synchronously scanning the substrate parallel or anti-parallel to this direction.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see for example U.S. Pat. No. 4,509,852, hereby incorporated in its entirety by reference) means that there is a large body of liquid that must be accelerated during a scanning exposure. This may require additional or more powerful motors and turbulence in the liquid may lead to undesirable and unpredictable effects.

One of the solutions proposed is for a liquid supply system to provide liquid on only a localized area of the substrate and in between the final element of the projection system and the substrate using a liquid supply system (the substrate generally has a larger surface area than the final element of the projection system). One way which has been proposed to arrange for this is disclosed in WO 99/49504, hereby incorporated in its entirety by reference. As illustrated in FIGS. 5 and 6 of the accompanying drawings, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 5 shows the arrangement schematically in which liquid is supplied via inlet IN and is taken up on the other side of the element by outlet OUT which is connected to a low pressure source. In the illustration of FIG. 5 the liquid is supplied along the direction of movement of the substrate relative to the final element, though this does not need to be the case. Various orientations and numbers of in- and out-lets positioned around the final element are possible, one example is illustrated in FIG. 6 in which four sets of an inlet with an outlet on either side are provided in a regular pattern around the final element.

In a conventional lithographic apparatus, the substrate is often clamped to a burl plate (sometimes referred to as a pimple plate or table) by pressure differential between the atmosphere above the substrate and a partially evacuated space below the substrate. The burl plate has a plurality of projections or raised portions (hereafter referred to as burls), such as pimples or concentric rings, distributed over the space within a vacuum wall corresponding to the perimeter of the substrate. The term "burls" sometimes is considered to refer to a swirl configuration but must be considered herein in a broader context to refer to any orientation of projections or raised portions. The substrate rests on the burls and optionally the vacuum wall, which may be made lower than the burls so that there is a controlled leak of air into the space under the substrate, as described, for example, in U.S. Pat. No. 6,232,615, which is hereby incorporated in its entirety by reference. A principal advantage of a burl plate is that the total area of the tops of the burls is very small compared to the area of the substrate so that there is a correspondingly small chance that a contaminant particle on the backside of the substrate will come between the substrate and a burl and hence distort the substrate. Thus, burls may also be used when the clamping force is electrostatic rather than by pressure differential.

SUMMARY

In a lithographic apparatus using a high-refractive index liquid, e.g. water, in the region between the final element of the projection lens and the substrate and a burl plate, the vacuum system generating the pressure differential needs to be able to cope with leakage of the immersion liquid, instead of or in addition to air, around the edge of the substrate. One solution to that problem is to provide additional vacuum pumping around the periphery of the substrate to cope with the leaking fluid. That results in an increased pressure differential across the substrate which in turn leads to distortion of the substrate.

Accordingly it would be desirable to provide a lithographic apparatus in which a high-refractive index liquid can be provided in the space between an element of the projection system and the substrate and in which distortion of the substrate can be reduced.

According to an aspect, there is provided a lithographic apparatus comprising:

an illumination system configured to provide a beam of radiation;

a support structure configured to hold a patterning device, the patterning device configured to impart the beam with a pattern in its cross-section;

a substrate table configured to hold a substrate, the substrate table comprising:

a plate comprising a plurality of burls, a density of the burls being higher in a peripheral portion of the substrate than in a medial portion thereof, and a port configured to exhaust a fluid so as to establish a pressure differential across the substrate held on the plate, the pressure differential being greater in the peripheral portion of the substrate than in the medial portion of the substrate;

a projection system configured to project the patterned beam onto a target portion of the substrate; and a liquid supply system configured to supply a liquid to a space between the projection system and the substrate.

Increased substrate distortion may appear due to burls in the region on the substrate having a higher pressure differential compressing more under the increased load. The substrate itself and the substrate table may also compress by different amounts under the different loads. By increasing the density of burls in the region of higher pressure differential, the load per area on each burl in that portion is reduced and hence its compression. Thus, the compression of the burls may be made more uniform and distortion of the substrate may be reduced.

In an embodiment, the ratio of the density of burls in the peripheral portion to the density of burls in the medial portion is substantially equal to the ratio of the pressure differentials in these portions during use of the apparatus.

In an embodiment, the burls in the peripheral and medial portions are all of substantially the same nominal size but their spacing is reduced in the peripheral portion so that the number per unit area is increased. In this way a more accurate equalization of the compression of the burls in the two portions can be achieved using known manufacturing techniques. In an embodiment, the cross-sectional area of the burls may be increased in the peripheral portion. It is even possible to vary both the size and spacing of the burls, provided there is a sufficient number of burls to ensure the bending of the substrate between burls is within tolerable limits. In some circumstances it may also be possible to increase the height of the burls in the outer region so that they compress to the same height as the burls in the middle.

In an embodiment, the peripheral portion is a substantially annular region extending inward of the outer periphery of the substrate. In a particular embodiment, the annular region has a width in the range of from 5% to 20% of the radius of the substrate.

In an embodiment, one or more gas inlets are provided under the medial portion of the substrate to provide a flow of gas under the substrate outward from the medial portion towards the peripheral portion. This gas flow assists in preventing liquid ingress to the space under the substrate.

In an embodiment, the burl plate has an upstanding wall separating the peripheral portion from the medial portion. The upstanding wall assists in maintaining the different pressure differentials in the medial and peripheral portions but may not be the same height as the burls so that there will be some gas leakage from the medial portion into the peripheral portion.

According to a further aspect, there is provided a device manufacturing method, comprising:

holding a substrate on a burl plate by a pressure differential across it, the pressure differential being greater in a peripheral portion of the substrate than in a medial portion thereof, and the density of burls on the burl plate being higher in the peripheral portion than in the medial portion; and projecting a patterned beam of radiation through a liquid onto a target portion of the substrate.

According to a further aspect, there is provided a burl plate for use in a lithographic projection apparatus in which a high-refractive index liquid is supplied to a space between a projection system of the lithographic projection apparatus and a substrate held on a substrate table of the lithographic apparatus, wherein the density of burls in a peripheral portion of the burl plate is higher than in a medial portion thereof.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm).

The term "patterning device" used herein should be broadly interpreted as referring to a device that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

Patterning devices may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of a patterning device, the support structure may be a frame or table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
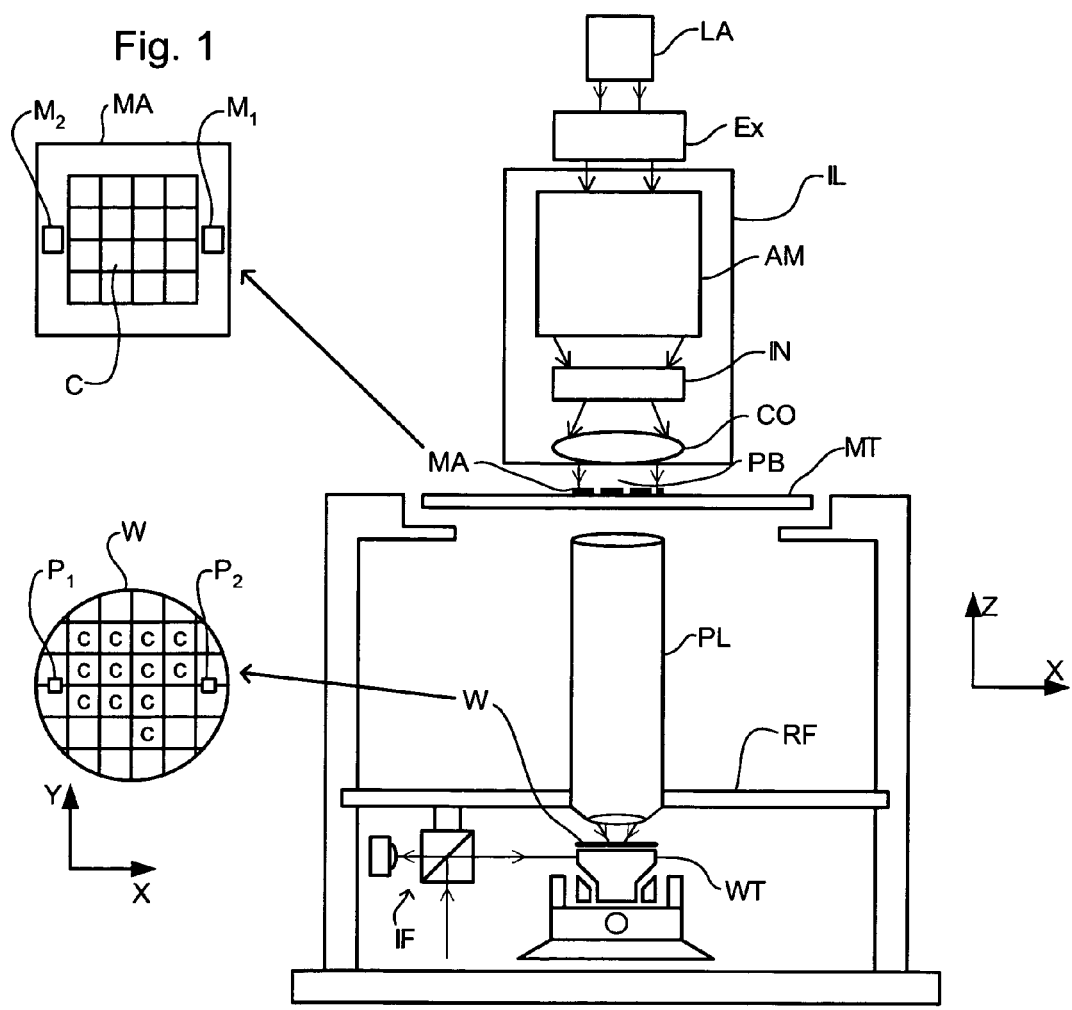
FIG. 1 depicts a lithographic apparatus according to an embodiment of the invention.

FIG. 1 schematically depicts a lithographic apparatus according to an embodiment of the invention. The apparatus comprises:

an illumination system (illuminator) IL for providing a projection beam PB of radiation (e.g. UV radiation or DUV radiation).

a first support structure (e.g. a mask table) MT for supporting a patterning device (e.g. a mask) MA and connected to a first positioning device PM for accurately positioning the patterning device with respect to item PL;

a substrate table (e.g. a wafer table) WT for holding a substrate (e.g. a resist-coated wafer) W and connected to a second positioning device PW for accurately positioning the substrate with respect to item PL; and a projection system (e.g. a refractive projection lens) PL for imaging a pattern imparted to the projection beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the apparatus, for example when the source is a mercury lamp. The source SO and the illuminator IL, together with the beam delivery system BD if required, may be referred to as a radiation system.

The illuminator IL may comprise an adjusting device AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The projection beam PB is incident on the mask MA, which is held on the mask table MT. Having traversed the mask MA, the projection beam PB passes through the lens PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning devices PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

An immersion lithography liquid supply system may be provided with a seal member which extends along at least a part of a boundary of the space between an element of the projection system and the substrate table. The seal member is substantially stationary relative to the projection system in the XY plane though there may be some relative movement in the X, Y or Z directions (where the Z direction is in the direction of the optical axis). A seal is formed between the seal member and the surface of the substrate. In an embodiment, the seal is a contactless seal such as a gas seal. Such a system is disclosed in, for example, U.S. patent application Ser. No. 10/705,783, hereby incorporated in its entirety by reference.

Figure 2:
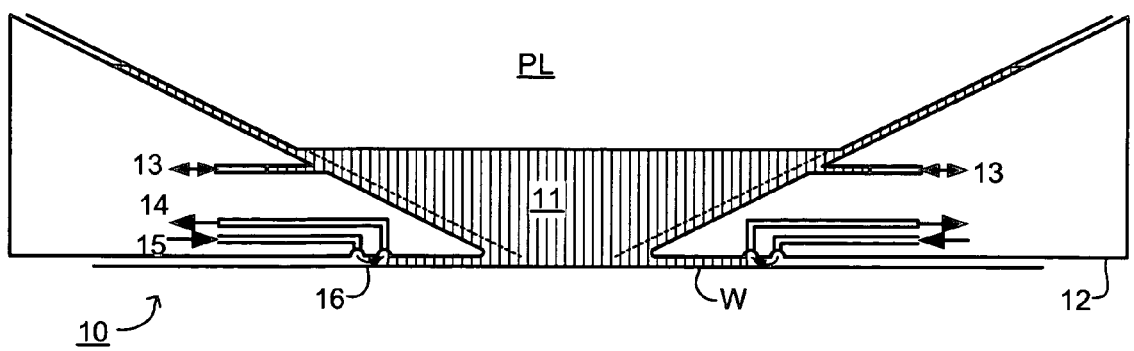
FIG. 2 depicts the liquid reservoir of the apparatus of FIG. 1.

FIG. 2 shows the liquid reservoir 10 between the projection system and the substrate stage. The liquid reservoir 10 is filled with a liquid 11 having a relatively high refractive index, e.g. water, provided via inlet/outlet ducts 13. The liquid has the effect that the radiation of the projection beam has a shorter wavelength in the liquid than in air or a vacuum, allowing smaller features to be resolved. It is well known that the resolution limit of a projection system is determined, inter alia, by the wavelength of the projection beam and the numerical aperture of the system. The presence of the liquid may also be regarded as increasing the effective numerical aperture. Furthermore, at fixed numerical aperture, the liquid is effective to increase the depth of field.

The reservoir 10 forms a contactless seal to the substrate around the image field of the projection system so that liquid is confined to fill a space between the substrate surface and the final element of the projection system. The reservoir is formed by a seal member 12 positioned below and surrounding the final element of the projection system PL. Liquid is brought into the space below the projection system and within the seal member 12. The seal member 12 extends a little above the final element of the projection system and the liquid level rises above the final element so that a buffer of liquid is provided. The seal member 12 has an inner periphery that at the upper end closely conforms to the step of the projection system or the final element thereof and may, e.g., be round. At the bottom, the inner periphery closely conforms to the shape of the image field, e.g., rectangular though this need not be the case.

Figure 3:
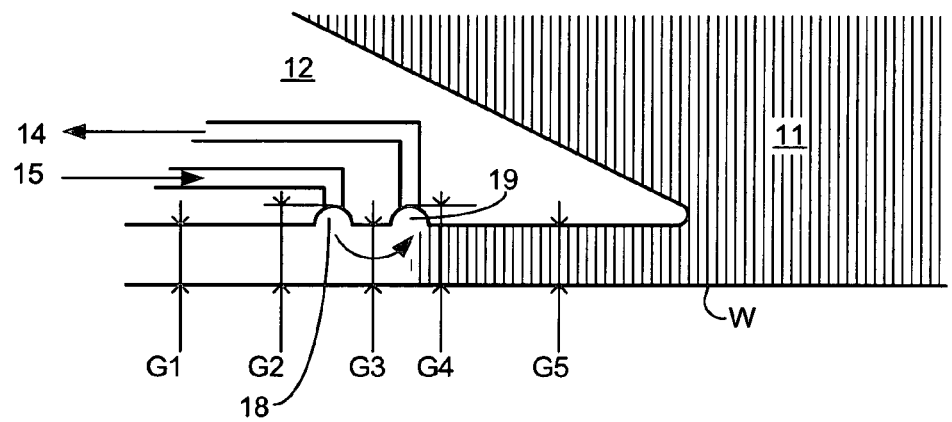
FIG. 3 is an enlarged view of part of the liquid reservoir of the apparatus of FIG. 1.

The liquid is confined in the reservoir by a gas seal 16 between the bottom of the seal member 12 and the surface of the substrate W. The gas seal is formed by gas, e.g. air or synthetic air but preferably $N_2$ or another inert gas, provided under pressure via inlet 15 to the gap between seal member 12 and substrate and extracted via first outlet 14. The overpressure on the gas inlet 15, vacuum level on the first outlet 14 and geometry of the gap are arranged so that there is a high-velocity air flow inwards that confines the liquid. This is shown in more detail in FIG. 3.

The gas seal is formed by two annular grooves 18, 19 which are connected to the first inlet 15 and first outlet 14 respectively by a series of small conducts spaced around the grooves. A large annular hollow in the seal member may be provided in each of the inlet and outlet to form a manifold. The gas seal may also be effective to support the seal member 12 by behaving as a gas bearing.

Gap G1, on the outer side of the gas inlet 15, is small and long so as to provide resistance to air flow outwards but need not be. Gap G2, at the radius of the inlet 15, is a little larger to ensure a sufficient distribution of gas around the seal member, the inlet 15 being formed by a number of small holes around the seal member. Gap G3 is chosen to control the gas flow through the seal. Gap G4 is larger to provide a good distribution of vacuum, the outlet 14 being formed of a number of small holes in the same manner as the inlet 15. Gap G5 is small to prevent gas/oxygen diffusion into the liquid in the space, to prevent a large volume of liquid entering and disturbing the vacuum and to ensure that capillary action will always fill it with liquid.

The gas seal is thus a balance between the capillary forces pulling liquid into the gap and the airflow pushing liquid out. As the gap widens from G5 to G4, the capillary forces decrease and the airflow increases so that the liquid boundary will lie in this region and be stable even as the substrate moves under the projection system PL.

The pressure difference between the inlet at G2 and the outlet at G4 as well as the size and geometry of gap G3, determine the gas flow through the seal 16 and will be determined according to the specific embodiment. However, a possible advantage is achieved if the length of gap G3 is short and absolute pressure at G2 is twice that at G4, in which case the gas velocity will be the speed of sound in the gas and cannot rise any higher. A stable gas flow will therefore be achieved.

The gas outlet system can also be used to completely remove the liquid from the system by reducing the gas inlet pressure and allowing the liquid to enter gap G4 and be sucked out by the vacuum system, which can easily be arranged to handle the liquid, as well as the gas used to form the seal. Control of the pressure in the gas seal can also be used to ensure a flow of liquid through gap G5 so that liquid in this gap that is heated by friction as the substrate moves does not disturb the temperature of the liquid in the space below the projection system.

The shape of the seal member around the gas inlet and outlet should be chosen to provide laminar flow as far as possible so as to reduce turbulence and vibration. Also, the gas flow should be arranged so that the change in flow direction at the liquid interface is as large as possible to provide maximum force confining the liquid.

The liquid supply system circulates liquid in the reservoir 10 so that fresh liquid is provided to the reservoir 10.

The gas seal 16 can produce a force large enough to support the seal member 12. Indeed, it may be necessary to bias the seal member 12 towards the substrate to make the effective weight supported by the seal member 12 higher. The seal member 12 will in any case be held in the XY plane (perpendicular to the optical axis) in a substantially stationary position relative to and under the projection system but decoupled from the projection system. The seal member 12 is free to move in the Z direction.

Figure 4:
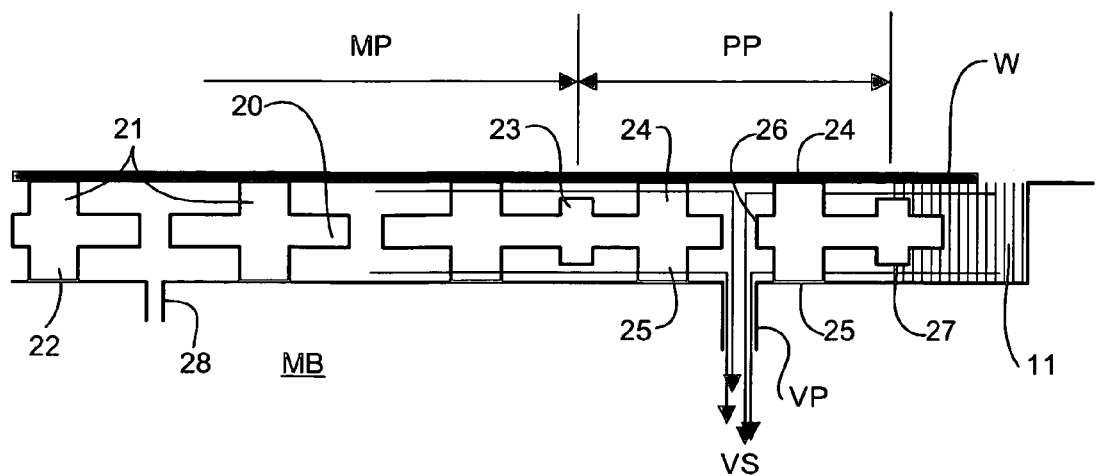
FIG. 4 depicts part of the substrate table of the apparatus of FIG. 1 showing the mounting of a substrate on a burl plate.
Figure 5:
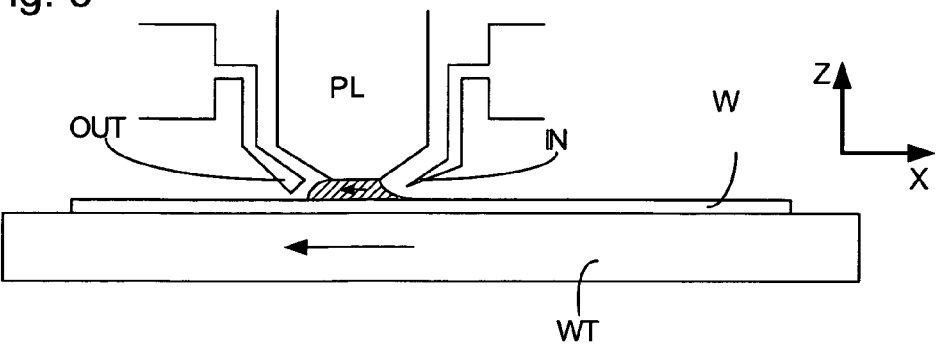
FIGS. 5 to 7 depict various liquid supply systems.
Figure 6:
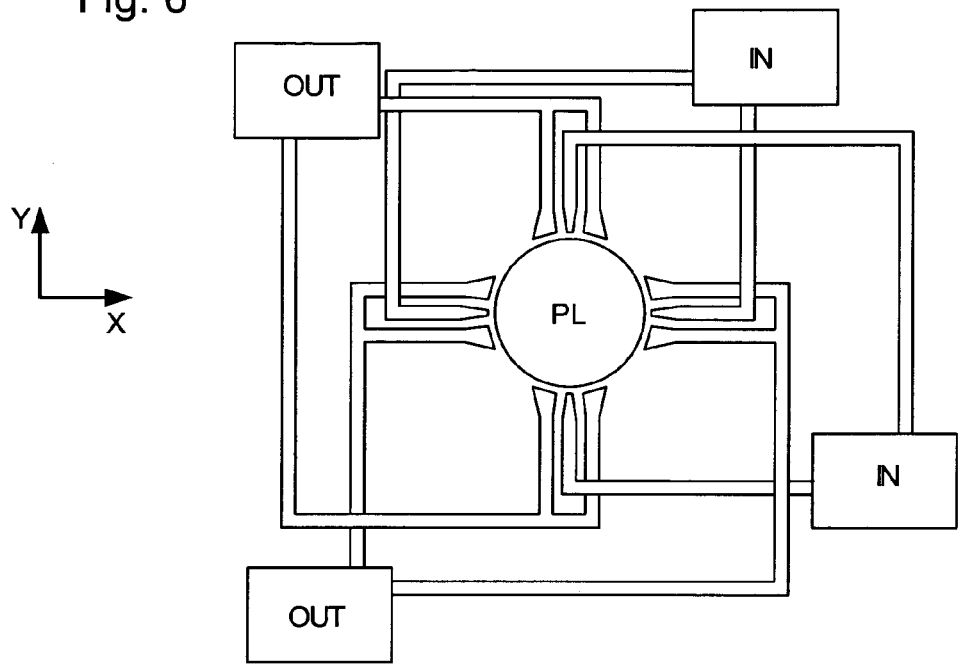

FIG. 4 shows the substrate clamping arrangements, according to an embodiment, in greater detail. Note that only part of the substrate is shown in FIG. 4. The substrate W rests on a burl plate 20 which in turn rests on a flat surface of the substrate table WT. The burl plate 20 has on its upper surface a plurality of projections 21, 24, referred to as burls. The burls may have a height in the range of 25 to 200 μm and the diameter of their upper surfaces may be in the range of from 0.5 to 0.05 mm. While there may be as many as 10,000 burls, the total area of the burls is small compared to that of the substrate itself so that if a contaminant, e.g. dust, particle adheres to the bottom of the substrate, there is only a small chance that the particle will come between a burl and the substrate and hence distort the substrate. A corresponding arrangement of burls 22, 25 is provided on the lower surface of the burl plate 20 so that the same effect is achieved in the case of dust particles between the mirror block MB (the upper part of the substrate table WT) and the burl plate 20. In an embodiment, the burls on the lower side of the burl plate have the same dimensions and spacing as those on the upper surface but this is not essential. In an embodiment, the burl plate 20 may be integral with the substrate table WT (e.g., integral to the mirror block MB). In such a case, there would be no need for the arrangement of burls 22, 25.

To clamp the substrate firmly in place, the space underneath the substrate is partially evacuated by vacuum system VS which connects to vacuum ports VP (only one shown) in the substrate table WT. Apertures 26 in the burl plate 20 equalize the pressure above and below the burl plate. A wall 27 around the edge of the substrate is provided—in an embodiment, it is slightly shorter than the burls to prevent it distorting the substrate and hence allows a controlled leakage into the space underneath the substrate.

In an immersion apparatus, some immersion liquid 11 will likely enter the space below the substrate since it is undesirable to seal the edge of the substrate to the substrate table. The amount of liquid will vary according to the type of liquid supply system used. With a localized or "showerhead" type system there may only be leakage when the edge of the substrate passes under the projection lens, e.g. during exposure of edge dies, whereas in a bath type apparatus leakage may be constant. Nevertheless, the leaking fluid should be removed and the vacuum system should therefore be capable of accepting a certain amount of liquid. It is also desired, in an embodiment, to reduce the pressure (increase the vacuum) around the periphery of the substrate below that required for effective clamping so as to ensure rapid removal of the leaking liquid and prevent leaked immersion liquid moving toward the center of the substrate table.

Thus, the vacuum ports V are located and the vacuum system VS is set up so that the pressure below the substrate in the peripheral portion PP is, for example, from 0.6 to 0.3 bar below atmospheric pressure while the pressure in the medial region MP is higher, for example, 0.5 to 0.25 bar below atmospheric pressure, the space above the substrate being at atmospheric pressure. To assist in maintaining the pressure differential, a wall 23 separates the medial from the peripheral portions. As with the outer wall 27, wall 23, in an embodiment, do not contact the substrate and/or the substrate holder but a narrow gap remains. A constant flow of gas, e.g. at a rate of 5 to 10 ms$^{-1}$, from the medial portion to the peripheral portion is also provided to prevent droplets of the immersion liquid migrating towards the center of the substrate. The gas flow can be provided by gas inlets 28, which may be simply connected to the atmosphere around the apparatus. To prevent too high a gas flow velocity, there are, in an embodiment, a large number of small inlets or, if a few larger inlets are employed, a flow restrictor is provided in the path to atmosphere.

However, the different pressures in the peripheral and medial portions would mean, if the burls were evenly distributed, that the forces on the burls would differ. This would cause the burls to be compressed by different amounts, as well as varying local compression of the substrate and the substrate table, leading to variations in substrate height. With a clamping pressure of the order of 0.5 bar and a burl pitch of the order of 3 mm, the burls compress by about 80 nm, so that a 20% variance in load on the burls would lead to a significant height variation. Accordingly, in an embodiment, the density of the burls is increased in the portion where the clamping pressure is higher so that the compression of the burls is more uniform. In this embodiment, the spacing of the burls 21, 22 in the peripheral portion is made lower than the spacing of burls 21, 22 in the medial portion such that the load on each burl is made constant. The spacing may be varied in the radial or circumferential directions or in both.

The width of the peripheral region will depend on the vacuum arrangements but may be in the range of 5 to 20% of the radius of the substrate, which is generally substantially equal to the radius of the burl plate. In general the peripheral portion will extend all the way around the burl plate but if there are parts where no leakage is to be expected, the peripheral portion may be omitted there.

Figure 7:
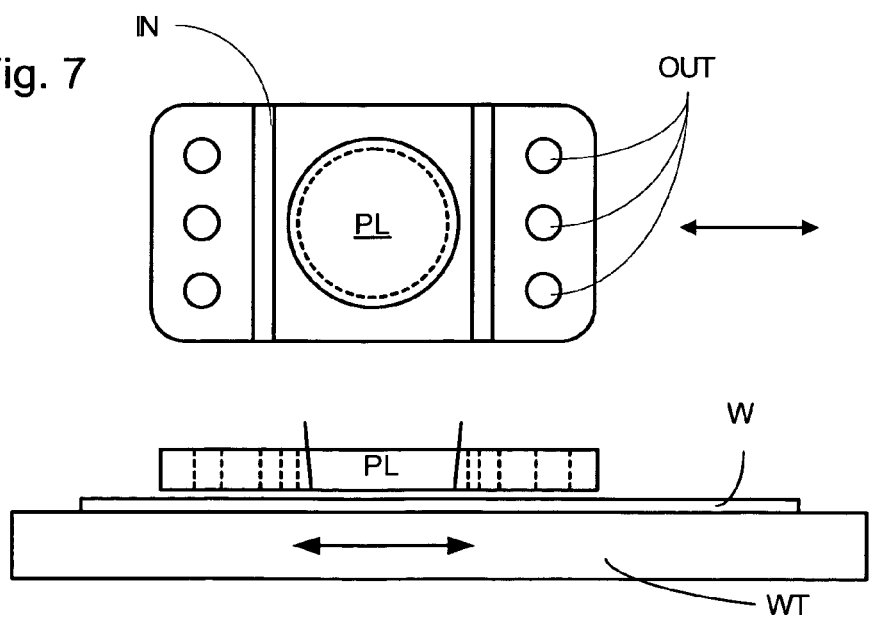

A further immersion lithography solution with a localized liquid supply system is shown in FIG. 7. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

In European patent application no. 03257072.3, hereby incorporated in its entirety by reference, the idea of a twin or dual stage immersion lithography apparatus is disclosed. Such an apparatus is provided with two substrate tables for supporting the substrate. Leveling measurements are carried out with a substrate table at a first position, without immersion liquid, and exposure is carried out with a substrate table at a second position, where immersion liquid is present. Alternatively, the apparatus can have only one substrate table moving between the first and second positions.

The present invention can be applied to any immersion lithography apparatus, in particular, but not exclusively, those types mentioned above.

While specific embodiments of the invention have been described above, it will be appreciated that the invention may be practiced otherwise than as described. The description is not intended to limit the invention.

The invention claimed is:

1. A lithographic apparatus comprising:
   an illumination system configured to provide a beam of radiation;
   a support structure configured to hold a patterning device, the patterning device configured to impart the beam with a pattern in its cross-section;
   a substrate table configured to hold a substrate, the substrate table comprising:
      a plate comprising a plurality of burls, a density of the buns being higher in a peripheral portion of the substrate than in a medial portion thereof, and
      a port configured to exhaust a gas and a liquid and to establish a pressure differential across the substrate held on the plate, the pressure differential being greater in the peripheral portion of the substrate than in the medial portion of the substrate;
   a projection system configured to project the patterned beam onto a target portion of the substrate; and
   a liquid supply system configured to supply a liquid to a space between the projection system and the substrate.

2. Apparatus according to claim 1, wherein the ratio of the density of burls in the peripheral portion to the density of burls in the medial portion is substantially equal to the ratio of the pressure differentials in these portions during use of the apparatus.

3. Apparatus according to claim 1, wherein the burls in the peripheral and medial portions are all of substantially the same nominal size but the number per unit area is greater in the peripheral portion.

4. Apparatus according to claim 1, wherein the cross-sectional area of the burls is greater in the peripheral portion.

5. Apparatus according to claim 1, wherein the peripheral portion is a substantially annular region extending inward of the outer periphery of the substrate and has a width in the range of from 5% to 20% of the radius of the substrate.

6. Apparatus according to claim 1, wherein the burl plate has an upstanding wall separating the peripheral portion from the medial portion.

7. Apparatus according to claim 1, comprising a gas inlet under the medial portion of the substrate to provide a flow of gas under the substrate outward from the medial portion towards the peripheral portion.

8. Apparatus according to claim 1, wherein the plate comprises a first surface configured to face the substrate and a second surface opposite the first surface, each of the first and second surfaces having burls disposed thereon.

9. Apparatus according to claim 8, wherein the plate further comprises an aperture extending between the first surface and the second surface to equalize pressure on each side of the plate.

10. A device manufacturing method comprising:
holding a substrate on a burl plate by a pressure differential across it, the pressure differential being greater in a peripheral portion of the substrate than in a medial portion thereof, and the density of burls on the burl plate being higher in the peripheral portion than in the medial portion;
exhausting a liquid from between the substrate and the burl plate; and
projecting a patterned beam of radiation through a liquid onto a target portion of the substrate.

11. Method according to claim 10, wherein the ratio of the density of burls in the peripheral portion to the density of burls in the medial portion is substantially equal to the ratio of the pressure differentials in these portions during use of the method.

12. Method according to claim 10, comprising providing a gas flow under the substrate outward from the medial portion towards the peripheral portion.

13. Method according to claim 11, wherein the cross-sectional area of the burls is greater in the peripheral portion.

14. Method according to claim 10, wherein the burl plate has an upstanding wall separating the peripheral portion from the medial portion.

15. Method according to claim 10, the burl plate comprising a first surface configured to face the substrate and a second surface opposite the first surface, each of the first and second surfaces having burls disposed thereon.

16. Method according to claim 15, comprising equalizing pressure on each side of the burl plate through an aperture extending between the first surface and the second surface.

17. A burl plate for use in a lithographic projection apparatus in which a high-refractive index liquid is supplied to a space between a projection system of the lithographic projection apparatus and a substrate held on a substrate table of the lithographic apparatus, wherein the density of buns in a peripheral portion of the burl plate is higher than in a medial portion thereof, and wherein the burl plate is configured to permit leakage of a liquid into a space between the burl plate and the substrate.

18. Burl plate according to claim 17, wherein the ratio of the density of burls in the peripheral portion to the density of burls in the medial portion is substantially equal to the ratio of the pressure differentials in these portions during use of the lithographic projection apparatus.

19. Burl plate according to claim 17, wherein the burls in the peripheral and medial portions are all of substantially the same nominal size but the number per unit area is greater in the peripheral portion.

20. Burl plate according to claim 17, wherein the cross-sectional area of the burls is greater in the peripheral portion.

21. Burl plate according to claim 17, wherein the peripheral portion is a substantially annular region extending inward of the outer periphery of the substrate and has a width in the range of from 5% to 20% of the radius of the substrate.

22. Burl plate according to claim 17, wherein the burl plate has an upstanding wall separating the peripheral portion from the medial portion.

23. Burl plate according to claim 17, wherein the burl plate comprises a first surface configured to face the substrate and a second surface opposite the first surface, each of the first and second surfaces having burls disposed thereon.

24. Burl plate according to claim 23, wherein the burl plate further comprises an aperture extending between the first surface and the second surface to equalize pressure on each side of the plate.

* * * * *